(12) United States Patent
Mecozzi et al.

(10) Patent No.: US 12,414,272 B2
(45) Date of Patent: Sep. 9, 2025

(54) COOLING SYSTEMS AND METHODS FOR USE IN DATA CENTERS

(71) Applicant: Integra Mission Critical, LLC, Dallas, TX (US)

(72) Inventors: Walter Paul Mecozzi, Edmond, OK (US); John A. Musilli, Jr., San Diego, CA (US); Thomas Neuman, Dallas, TX (US); John Kolar, Clearwater, FL (US)

(73) Assignee: Integra Mission Critical, LLC, Dallas, TX (US)

( * ) Notice: Subject to any disclaimer, the term of this patent is extended or adjusted under 35 U.S.C. 154(b) by 216 days.

(21) Appl. No.: 17/820,880

(22) Filed: Aug. 18, 2022

(65) Prior Publication Data

US 2023/0058349 A1 Feb. 23, 2023

Related U.S. Application Data

(60) Provisional application No. 63/235,045, filed on Aug. 19, 2021.

(51) Int. Cl.
*H05K 7/20* (2006.01)

(52) U.S. Cl.
CPC .............................. *H05K 7/20827* (2013.01)

(58) Field of Classification Search
CPC ........... H05K 7/20827; H05K 7/20345; H05K 7/2079
See application file for complete search history.

(56) References Cited

U.S. PATENT DOCUMENTS

| 9,915,453 B2 | 3/2018 | Moses | |
| 2009/0201645 A1* | 8/2009 | Kashirajima | H05K 7/20827 165/104.33 |
| 2015/0377535 A1 | 12/2015 | Kono | |

FOREIGN PATENT DOCUMENTS

| CN | 104244678 A | * | 12/2014 | |
| CN | 103499137 B | | 1/2017 | |
| CN | 110191619 A | | 8/2019 | |
| CN | 110636744 A | | 12/2019 | |
| CN | 110191619 B | * | 3/2021 | ............ F24F 5/0035 |
| JP | 2011141055 A | | 7/2011 | |
| KR | 10-2021-0020588 A | | 2/2021 | |

OTHER PUBLICATIONS

International Search Report and Written Opinion issued Jan. 17, 2023 regarding International Application No. PCT/US2022/075230, 10 pages.
Partial European Search Report issued Jul. 9, 2025 regarding Application No. 22859432.1, 12 pages.

* cited by examiner

*Primary Examiner* — Ana M Vazquez (57) ABSTRACT

A system includes one or more modular hot aisle cooling units (MHACUs) disposed in a data hall, each MHACU configured to cool one or more servers in the data hall. The system also includes a fluid cooler configured to receive the heated fluid from the one or more MHACUs, cool the heated fluid into cooled fluid, and output the cooled fluid. The system also includes a fluid supply line configured to convey the cooled fluid to the one or more MHACUs in order to cool heated air inside the data hall. The system also includes a pump package configured to control a flow of the heated fluid and the cooled fluid. The fluid cooler, the one or more MHACUs, and the pump package form a single fluid loop.

20 Claims, 9 Drawing Sheets

COOLING SYSTEMS AND METHODS FOR USE IN DATA CENTERS

CROSS-REFERENCE TO RELATED APPLICATIONS AND PRIORITY CLAIM

This application claims priority under 35 U.S.C. § 119(e) to U.S. Provisional Patent Application No. 63/235,045 filed on Aug. 19, 2021, which is hereby incorporated by reference in its entirety.

TECHNICAL FIELD

Embodiments of the present disclosure relate to cooling systems and, in particular, to cooling systems and methods for use in colocation data centers.

BACKGROUND

Colocation data centers typically require flexibility in space utilization to accommodate diverse customer requirements. For example, some colocation data centers must be equipped to provide space for both ASHRAE (American Society of Heating, Refrigerating, and Air-Conditioning Engineers) allowable and ASHRAE recommended customers. Many data center providers prefer closed systems, in which no direct outside air is supplied to the data hall for cooling. This reduces the advantage of ASHRAE allowable cooling, which can be accomplished with direct evaporative cooling and air side economization. Closed systems also typically require mechanical refrigeration, which results in high energy usage and high installation costs. Existing colocation data centers are at a disadvantage to climate site specific data centers that can offer direct evaporative and/or outside air solutions to large customers with ASHRAE recommended conditions.

SUMMARY

This disclosure provides cooling systems and methods for use in colocation data centers.

In a first embodiment, a system includes one or more modular hot aisle cooling units (MHACUs) disposed in a data hall, each MHACU configured to cool one or more servers in the data hall. The system also includes a fluid cooler configured to receive the heated fluid from the one or more MHACUs, cool the heated fluid into cooled fluid, and output the cooled fluid. The system also includes a fluid supply line configured to convey the cooled fluid to the one or more MHACUs in order to cool heated air inside the data hall. The system also includes a pump package configured to control a flow of the heated fluid and the cooled fluid. The fluid cooler, the one or more MHACUs, and the pump package form a single fluid loop.

In a second embodiment, a method includes receiving, at a fluid cooler, heated fluid from one or more MHACUs disposed in a data hall, each MHACU configured to cool one or more servers in the data hall. The method also includes cooling the heated fluid into cooled fluid at the fluid cooler. The method also includes outputting the cooled fluid from the fluid cooler. The method also includes conveying the cooled fluid to the one or more MHACUs in order to cool heated air inside the data hall. The method also includes controlling a flow of the heated fluid and the cooled fluid using a pump package. The fluid cooler, the one or more MHACUs, and the pump package form a single fluid loop.

In a third embodiment, a cooler includes a first coil, a second coil, and a fluid supply line provided to couple the first coil and the second coil together in series. The second coil is configured to receive heated fluid conveyed through the fluid supply line from outside the cooler, and cool the heated fluid into cooled fluid as the heated fluid passes through the second coil. The first coil is configured to additionally cool the cooled fluid as the cooled fluid passes through the first coil after passing through the second coil. The fluid supply line is configured to convey the cooled fluid outside the cooler after the cooled fluid passes through the first coil. The first coil and the second coil are disposed together in a common air stream, wherein air flows through the first coil and then through the second coil.

Other technical features may be readily apparent to one skilled in the art from the following figures, descriptions, and claims.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include anyone, more than one, or all of the features described here. Also, embodiments of this disclosure may additionally or alternatively include other features not listed here.

As discussed above, colocation data centers typically require flexibility in space utilization to accommodate diverse customer requirements. For example, some colocation data centers must be equipped to provide space for both ASHRAE allowable and ASHRAE recommended customers. Many data center providers prefer closed systems, in which no direct outside air is supplied to the data hall for cooling. This reduces the advantage of ASHRAE allowable cooling, which can be accomplished with direct evaporative cooling and air side economization. Closed systems also typically require mechanical refrigeration, which results in high energy usage and high installation costs. Existing colocation data centers are at a disadvantage to climate site specific data centers that can offer direct evaporative outside air solutions to large customers with ASHRAE recommended conditions.

To address these and other issues, embodiments of the present disclosure provide an outdoor fluid cooler system for use with colocation data centers. The disclosed outdoor fluid cooler system is designed to operate at a wide range of Entering Fluid Temperatures (EFTs) and Leaving Fluid Temperatures (LFTs). This wide range of thermal capability brings the closed system designs and preferences within the energy efficient capabilities of direct evaporative cooling and air side economization. One efficiency of the fluid cooler is derived from the elevated EFT aggerated and/or controlled using serial heating of the fluid flow from an indoor modular hot aisle cooling unit (MHACU) system. The indoor system, through a series of valves, sensors, and control sequences, can return the highest thermal fluid heat content possible with the prescribed supply air settings for the rack, or row, or room, or facility. The fluid cooler system can provide LFT that can meet ASHRAE Recommended and Allowable "A1 through A4" compute equipment class in a liquid-to-liquid heat exchanger transfer and/or a liquid-to-air transfer in a MHACU. The outside fluid cooler system can include a thermal storage and/or mixing tank to maintain the thermal rate of change specified by ASHRAE or specific compute equipment manufactures.

The fluid cooler system can achieve the prescribed efficiencies and outputs through a combination and/or sequential application of one or more heat rejection solutions (i.e., "Hybrid") configured in a serial, parallel, and/or bypass topology. The hybrid fluid cooler system can utilize ambient environmental conditions, air, and/or water, and can add additional heat rejection paths through a series of coils. The hybrid fluid cooler system can include mechanical and/or absorption cooling to trim the LFT to the prescribed value for end user requirements. The hybrid cooler system provides much improved efficiency by blending the advantages of direct evaporative cooling with the minimal use of mechanical refrigeration cooling.

Figure 1:
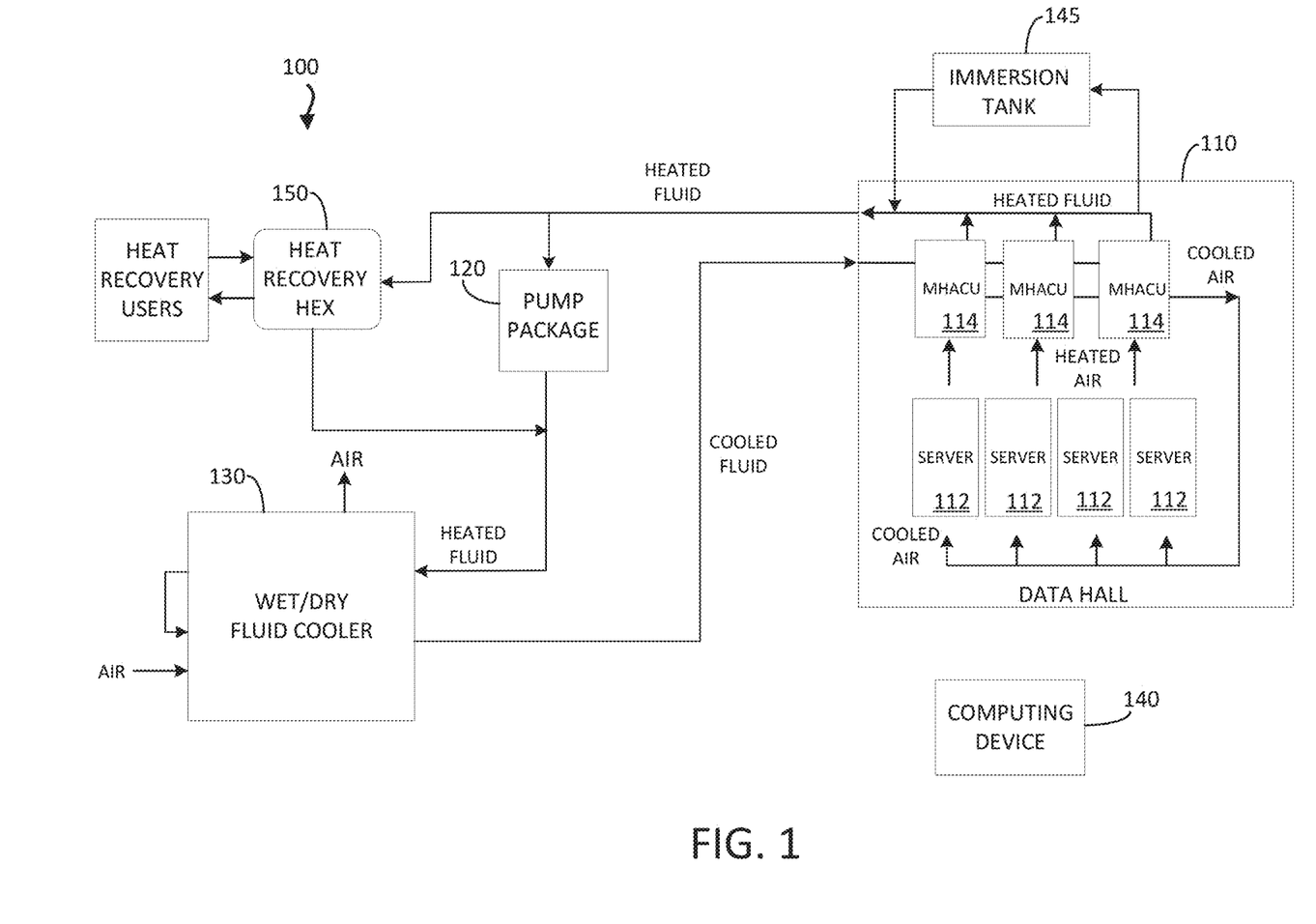
FIG. 1 illustrates an example cooling system for cooling a data center according to this disclosure.

FIG. 1 illustrates an example cooling system 100 for cooling a data center according to this disclosure. The embodiment of the cooling system 100 shown in FIG. 1 is for illustration only. Other embodiments of the cooling system 100 could be used without departing from the scope of this disclosure.

As shown in FIG. 1, the cooling system 100 includes a data hall 110, a pump package 120, a fluid cooler 130, and a computing device 140.

The data hall 110 represents at least a portion of a colocation data center and is an enclosed space that houses a plurality of servers 112 that are arranged in server racks. As known in the art, the servers 112 generate substantial amounts of thermal energy that tend to heat the space inside the data hall 110, thereby requiring cooling to maintain the temperature of the data hall 110 at a suitable level for proper operation of the servers 112 and for comfort of any personnel inside the data hall 110.

The data hall 110 includes one or more modular hot aisle cooling units (MHACUs) 114. The MHACUs 114 are disposed above, behind, in front of, or otherwise proximate to the servers 112 and are operable to cool the servers 112. In particular, each MHACU 114 can be mounted above a hot aisle, behind and/or in front of the servers 112 in the data hall 110. The MHACUs 114 cool the servers 112 by receiving heated air (e.g., approximately 110° F.-140° F. for ASHRAE allowable or approximately 100° F. for ASHRAE recommended) rising from the servers 112, cooling the heated air into cooled air (e.g., approximately 95° F. for ASHRAE allowable or approximately 80° F. for ASHRAE recommended), and outputting the cooled air to cool the servers 112. Each MHACU 114 is modular, and sits above, behind, and/or in front of one or more of the racks of servers 112. FIG. 1 shows three MHACUs 114, but there may be more or fewer depending on the embodiment. The number of MHACUs 114 is easily scaled for the application and depends on the load density of the servers 112, the cooling capacity of each MHACU 114, and the like. In some embodiments, each MHACU 114 is capable of providing approximately 150 kW to greater than 300 kW of cooling capacity, although other values are possible and within the scope of this disclosure.

Each MHACU 114 can be individually controlled (including air throughput, leaving air temperature, and leaving fluid temperature) in order to customize cooling levels in real time in different parts of the data hall 110. For example, if some of the servers 112 generate a greater load and require additional cooling, then one or more MHACUs 114 in the vicinity of those servers 112 can be controlled to increase cooling capacity.

The MHACUs 114 are connected in series or parallel to each other, and are fluidly coupled, via one or more fluid supply lines, to the pump package 120 and the fluid cooler 130. In some embodiments, the pump package 120 is disposed downstream from the MHACUs 114 and upstream from the fluid cooler 130. The pump package 120 operates to pump the heated fluid from the MHACUs 114 to the fluid cooler 130, where the fluid is cooled before being conveyed to the MHACUs 114 via one or more fluid supply lines. Together, the MHACUs 114, the pump package 120, and the fluid cooler 130 form a single fluid loop that operates due to pumping action of the pump package 120.

In one aspect of operation, cooled fluid (e.g., approximately 90° F. for ASHRAE allowable or approximately 75° F. for ASHRAE recommended) received from the fluid cooler 130 flows into each MHACU 114 and is used to cool the heated air from the servers 112. Once the fluid cools the heat air within the data hall 110, the heated fluid then flows to the pump package 120 and is then pumped back to the fluid cooler 130. In some embodiments, at least a portion of the heated fluid can be routed to one or more immersion tanks 145 for use with an immersion cooling system. In some embodiments, the fluid is water, although other suitable fluids may be used and are within the scope of this disclosure.

Figure 3:
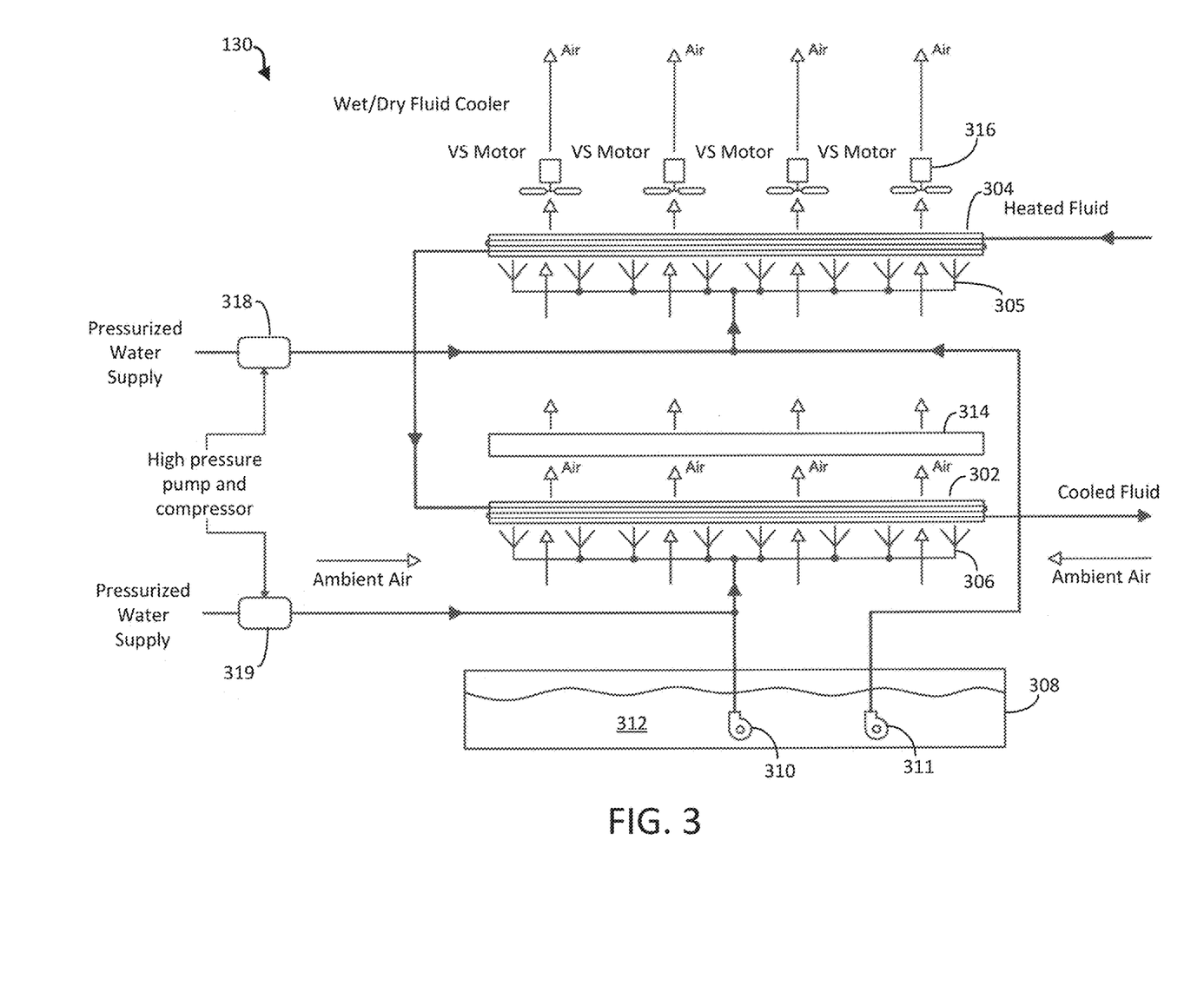
FIG. 3 illustrates further details of one example of a fluid cooler according to this disclosure.

FIG. 3 illustrates further details of one example of the fluid cooler 130 according to this disclosure. As shown in FIG. 3, the fluid cooler 130 includes multiple cooling coils, including a first coil 302 and a second coil 304. In some embodiments, the first coil 302 is mounted below or before the second coil 304. The first coil 302 and the second coil 304 are disposed together in a common air stream that is controlled by one or more variable speed fans 316. A control system (which can be part of or include the computing device 140) coupled to a thermometer or other sensor can be used to control operation and speed of the fan(s) 316. When the fan(s) 316 are in operation, ambient air is drawn from below and upward or in front of and across the first coil 302, passing through the first coil 302 and the second coil 304. The moving air provides cooling for the heated fluid that passes through the fluid cooler 130. In operation, the heated fluid passes through the second coil 304, where the fluid is partially cooled, then through the first coil 302, where the fluid is additionally cooled.

The first coil 302 is part of a spray coil system that includes multiple spray nozzles 306, a basin 308 or direct water hook up to site pressurized water distribution, and a pump 310. During operation of the fluid cooler 130, the pump 310 is operable to be selectively turned on and off. When the pump 310 is on, the pump 310 draws water 312 from the basin 308 or pressurized distribution and sprays the water 312 over the first coil 302. The water 312 on the first coil 302 provides an evaporative cooling effect for cooling the first coil 302, which helps to cool the fluid passing through the first coil 302.

A moisture eliminator structure 314 is disposed between the first coil 302 and the second coil 304, which are spaced far enough apart to accommodate the moisture eliminator structure 314. The moisture eliminator structure 314 blocks the spray of water over the first coil 302 from reaching the second coil 304. This helps to ensure that the second coil 304 stays dry and protected from moisture. The moisture eliminator structure 314 can include a water-proof membrane or any other suitable structure for blocking moisture from the second coil 304.

In the fluid cooler 130, only a portion of the cooling load for cooling the fluid is being performed by the wet first coil 302. Additional cooling is performed by the dry second coil 304. The spraying of water 312 to wet the first coil 302 is controlled based on the ambient dry bulb temperature around the fluid cooler 130, the cooling load of the fluid (e.g., the desired output temperature of the cooled fluid), or a combination of these. For example, a control system (which can be part of or include the computing device 140) coupled to a thermometer or other sensor can be used to control operation of the pump 310. When the ambient dry bulb temperature is above a predetermined threshold temperature (e.g., above approximately 75° F.), the pump 310 can be activated to spray water 312 to wet the first coil 302, in order to increase cooling at the first coil 302. When the ambient dry bulb temperature is low enough (e.g., below approximately 75° F.), the first coil 302 does not need to be wet to provide adequate cooling to the fluid. This reduces both peak and overall amounts of water used for cooling. For example, compared to existing cooling towers with similar cooling load capacity, the fluid cooler 130 can reduce peak water usage by as much as 50%, and can reduce overall water usage by as much as 90%, thereby saving millions of gallons of water annually.

The second coil 304 is part of an independent spray coil system that includes multiple spray nozzles 305, the basin 308 or direct water hook up to site water distribution, and a pump 311. During operation of the fluid cooler 130, the pump 311 is operable to be selectively turned on and off. When the pump 311 is on, the pump 311 draws water 312 from the basin 308 or pressurized water distribution and sprays the water 312 over the second coil 304. The water 312 on the second coil 304 precools the cooling fluid and provides a first stage evaporative cooling effect for cooling the fluid entering the first coil 302. The water 312 on the first coil 302 provides additional evaporative cooling effect if required to meet the prescribed LFT for the first coil 302. The cooled fluid is then returned directly to the MHACUs 114. While FIG. 3 shows only one basin 310, this is merely one example. Other embodiments can include separate basins 310 for providing water 312 to the first coil 302 and the second coil 304.

For the second coil 304, the spray nozzles 305 provide a supplemental cooling boost to increase capacity during extreme weather events when used in conjunction with the first coil 302 using the pump/basin system or pressurized water system. One function of the second coil 304 is to save water and take advantage of the evaporative cooling effect of the ambient air as it passes through the first coil 302. When the pump 311 is off, the second coil 304 can only transfer sensible heat to the cooling airstream provided by the fans 316.

When the pumps 310 and 311 are on, the heat transfer is different. The heat from the coil is transferred to the water film on the surface of the coil 302 and is evaporated, thus increasing the wet bulb temperature in the space between coils 302 and 304. This increase of wet bulb temperature is relatively small, e.g., 1° F. to 3° F. At the same time as the airstream is picking up heat from water evaporation, it is also adiabatically cooling the air and reducing the dry bulb temperature. This increases the effectiveness of the second coil 304 to transfer heat to the airstream in a dry state. The water savings as compared to a cooling tower come from the recovery of the adiabatic air cooling by the dry second coil 304, which does not happen in an open or closed loop cooling tower.

In some embodiments, the first coil 302 and the second coil 304 are each sized to provide approximately one half of the cooling capacity of the fluid cooler 130. This results in a roughly 50% reduction in water usage when compared to a similarly sized cooling tower. This results in 50% lower peak water consumption. Because the pumps 310 and 311 can be shut off and the fluid cooler 130 operated without water evaporation when the ambient dry bulb temperature falls below 65° F., the annual water consumption can be reduced as much as 90% as compared to a conventional closed or open cooling tower.

The use of a pressurized water misting system with the spray nozzles eliminates the need for a sump and also eliminates the surface evaporation losses, blowdown, and maintenance required for this component. The pressurized water misting system connects directly to a high pressure (e.g., >1000 psi) water misting compressor and pump 318-319 designed to atomize the water to a droplet like fog or mist. This misting feature is pulsed by the pump/compressor controls output derived from the input sensors measuring ambient air temperature, coil fluid temperature, and air flow across the coil surface. Through the controllers' calculations, the precise amount of water needed to evaporate from the coil surface can be delivered as a mist or fog to meet the prescribed coil LFT. In some embodiments, a sump and/or the misting fog technique may be used in combination with any number of coils to reach the prescribed LFT output.

The fluid cooler 130 also provides energy savings and better humidity control compared to existing direct evaporative cooling systems. For example, the fluid cooler 130 allows control of the temperature in the data hall 110 to ASHRAE allowable conditions when the outside air wet bulb temperature is 85° F. or less. The close approach to the wet bulb temperature enables cooling without a compressor for ASHRAE allowable data halls. Similarly, use of the fluid cooler 130 enables reduced compressor sizing in a trim chiller (see FIG. 2) for ASHRAE recommended sites. The use of the fluid cooler 130 results in a better power usage effectiveness (PUE) than cooling systems that use direct evaporation and equivalent water usage.

In some embodiments, the system 100 also includes a heat recovery heat exchanger 150 for use in downstream heat recovery to support the needs of one or more heat recovery users. In some embodiments, the immersion tanks 145 can also generate higher quality heat suitable for downstream heat recovery. This high quality heat is available to the heat recovery heat exchanger 150 to support the needs of a heat recovery user.

While FIG. 1 shows the cooling system 100 with one fluid cooler 130, this is merely one example. In other embodiments, the cooling system 100 could include multiple fluid coolers 130, each with isolated flow. In further embodiments, the cooling system 100 could include multiple fluid coolers 130 individually connected in series and/or connected in parallel with combined flow for redundancy. In still other embodiments, the cooling system 100 could include multiple fluid coolers 130 with combined flow for cooling multiple data halls 110, thus providing increased redundancy at a lower cost.

As discussed above, the cooling system 100 includes one or more computing devices 140 to control the operations of the cooling system 100. In some embodiments, each computing device 140 may be a service operated by a third party such as a person or a company. Each computing device 140 may be housed and operated at a location different than the location at which the rest of the cooling system 100 is located. That is to say, each computing device 140 is not bound to a specific location.

Figure 2:
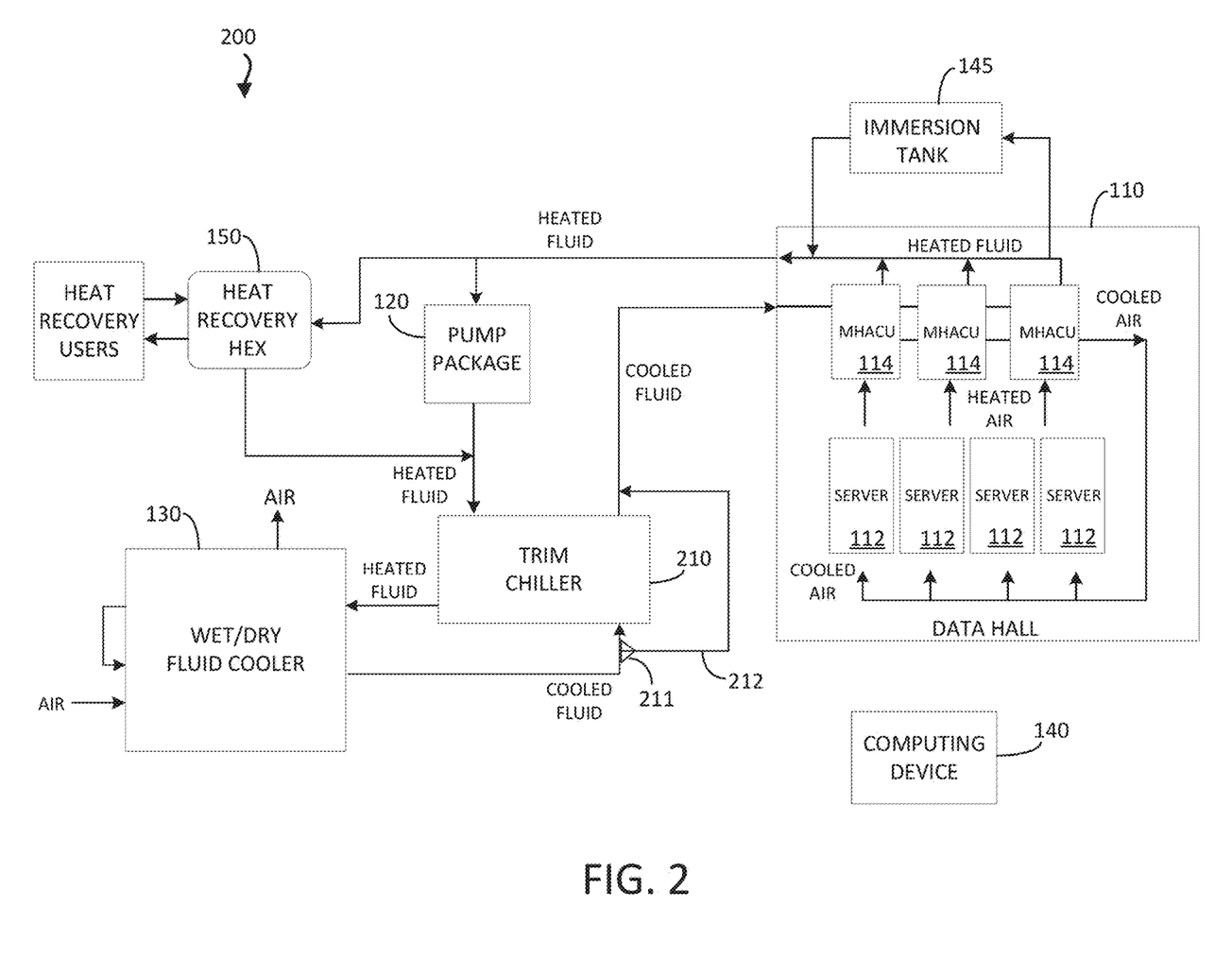
FIG. 2 illustrates another example cooling system for cooling a data center according to this disclosure.

FIG. 2 illustrates another example cooling system 200 for cooling a data center according to this disclosure. The embodiment of the cooling system 200 shown in FIG. 2 is for illustration only. Other embodiments of the cooling system 200 could be used without departing from the scope of this disclosure.

As shown in FIG. 2, the cooling system 200 includes multiple components that are the same as, or similar to, corresponding components in FIG. 1. For example, the cooling system 200 includes a data hall 110, a pump package 120, a fluid cooler 130, and a computing device 140. The cooling system 200 also includes a trim chiller 210 fluidly coupled between the fluid cooler 130 and the MHACUs 114. While the cooling system 100 of FIG. 1 is suitable for ASHRAE allowable sites (and may be suitable for ASHRAE recommended sites, depending on the particular implementation and location), the addition of the trim chiller 210 in the cooling system 200 adds additional cooling capacity in the cooling system 200. Specifically, the trim chiller 210 allows the cooling system 200 to deliver cooled fluid to the MHACUs 114 at a lower temperature than can be achieved by the fluid cooler 130 at the site's maximum wet bulb temperature. This helps to ensure that the cooling system 200 is suitable for all ASHRAE recommended sites. In some embodiments, when the fluid cooler leaving fluid temperature (LFT) meets the requirements of the facility, a control valve 211 downstream or upstream of the trim chiller 210 can be commanded to open to a bypass loop 212 that removes the trim chiller 210 from the process. This activity further improves the efficiency of the overall cooling solution.

For example, in some implementations with a maximum site ambient wet bulb temperature of 80° F., the fluid cooler 130 can be operated to output fluid temperatures at or around 85° F. This fluid temperature can be too high to support ASHRAE recommended conditions, which require the cold aisle air temperature (i.e., essentially the air temperature leaving the MHACU 114) to be 80° F. To achieve 80° F. leaving air temperature, an entering fluid temperature at or around 75° F. may be required. The trim chiller 210 can reduce the fluid temperature to 75° F. The trim chiller 210 includes a cold heat exchanger in series with the fluid flow returning from the fluid cooler 130.

In one aspect of operation, the MHACUs 114 are controlled to provide the required cold aisle temperature and produce a large fluid temperature rise (e.g., 15 to 25° F.). As long as the fluid temperature rise in the MHACUs 114 is greater than the fluid temperature drop in the trim chiller 210, the capacity requirement of the trim chiller 210 is lower than the cooling load in the data hall 110. In this example, the cold fluid temperature drop in the trim chiller 210 is 10° F. If the fluid temperature rise in the MHACUs 114 is selected and controlled at 15° F., the trim chiller 210 needs to supply only 67% of the cooling load. If the fluid temperature rise in the MHACUs 114 is controlled to 25° F., the trim chiller 210 needs to supply only 40% of the cooling load.

Fluid output from the MHACUs 114 flows to a hot heat exchanger in the trim chiller 210 where it picks up heat and increases fluid temperature. The fluid then flows to the fluid cooler 130 where the heat from the servers 112 and the additional heat from the compressor power is rejected to the ambient air.

The power input of the trim chiller 210 is reduced when the ambient wet bulb temperature drops below the maximum and is not required when the fluid cooler 130 can produce the cooled fluid to the MHACUs 114 at approximately 70° F. wet bulb and below in this example. Water consumption is not required when the ambient dry bulb temperature drops below 65° F.

Figure 4:
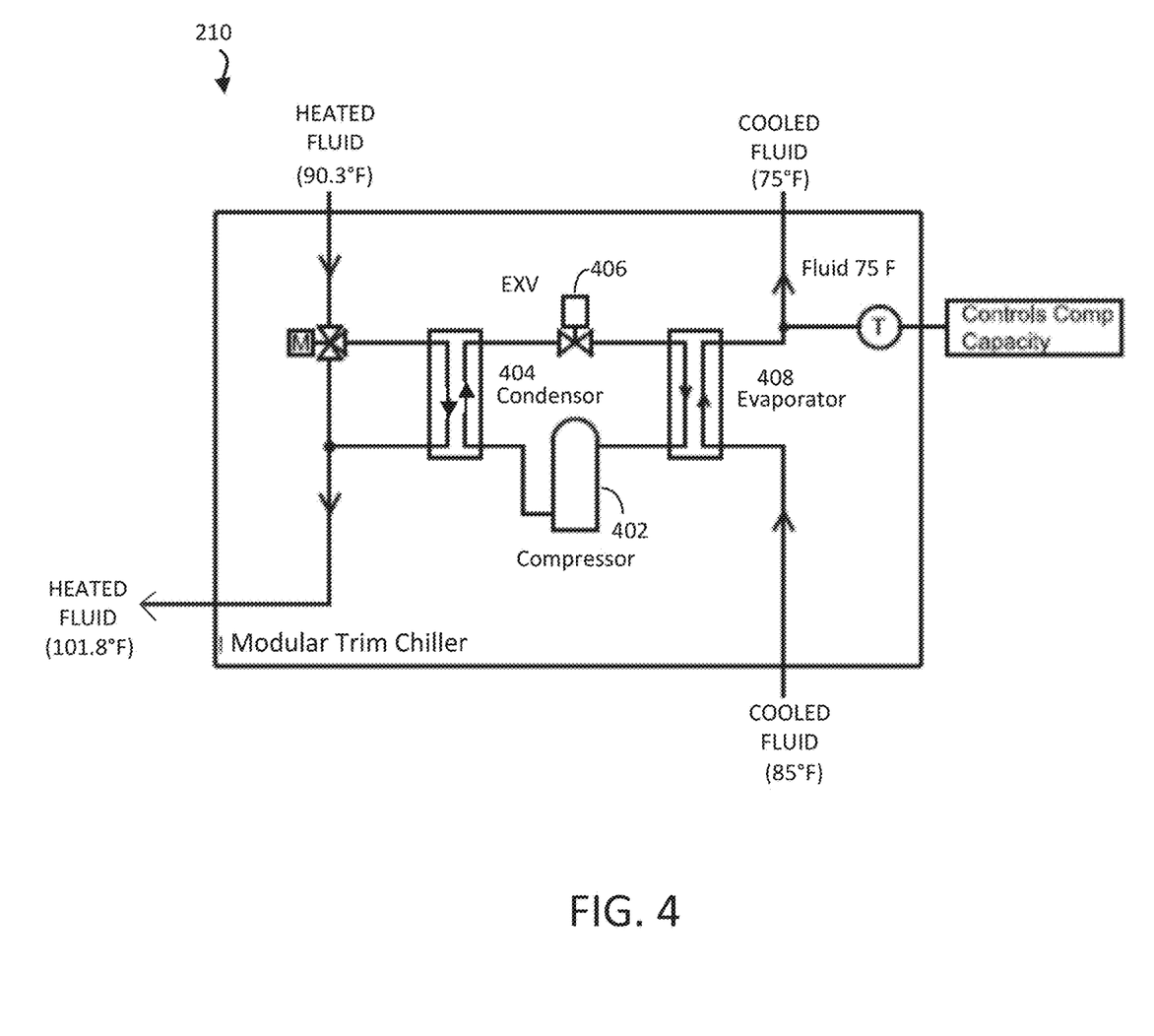
FIG. 4 illustrates further details of one example of a trim chiller according to this disclosure.

FIG. 4 illustrates further details of one example of the trim chiller 210 according to this disclosure. As shown in FIG. 4, the trim chiller 210 includes a refrigeration loop that includes a compressor 402, a condenser 404, an expansion valve 406, and an evaporator 408. The trim chiller 210 receives cooled fluid (e.g., approximately 85° F.) from the fluid cooler 130 and further cools the cooled fluid to a lower temperature (e.g., approximately 75° F., which is suitable for ASHRAE recommended sites). To cool the cooled fluid, the trim chiller 210 uses the refrigeration loop to transfer thermal energy from the cooled fluid to heated fluid (e.g., approximately 90.3° F.) that is received from the pump package 120. As a result of the thermal energy transfer, the heated fluid is further heated to a higher temperature (e.g., approximately 101.8° F.). The heated fluid is output from the trim chiller 210 to the fluid cooler 130, while the cooled fluid is output from the trim chiller 210 to the MHACUs 114 in the data hall 110.

Figure 5A:
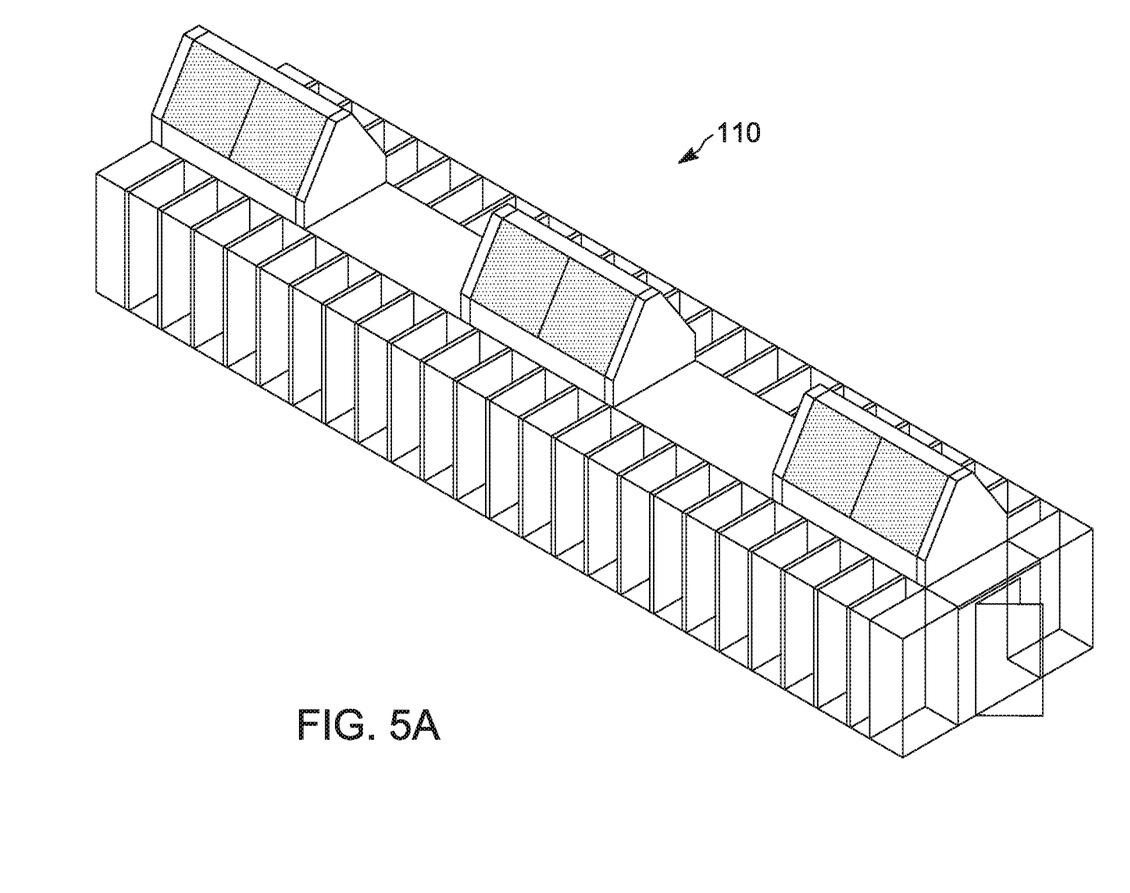
FIGS. 5A through 5C illustrate example data halls with different levels of cooling density according to this disclosure.
Figure 5B:
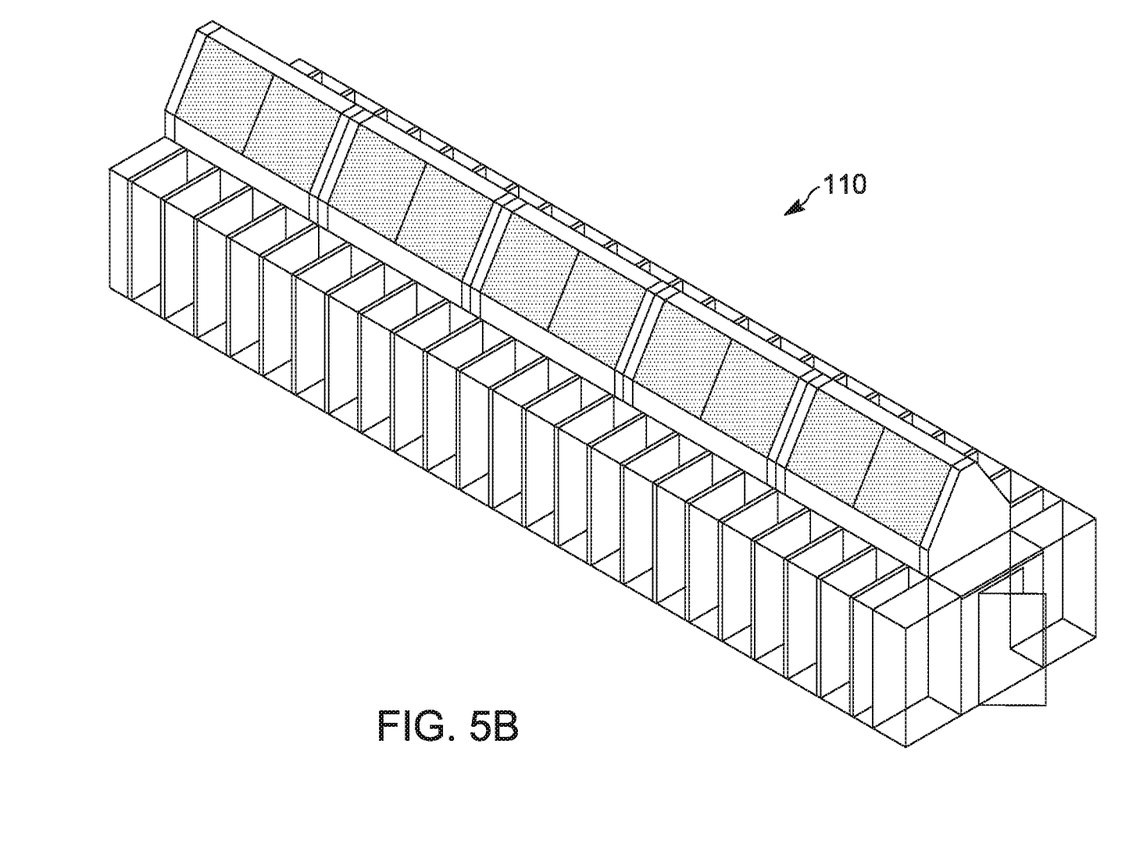
Figure 5C:
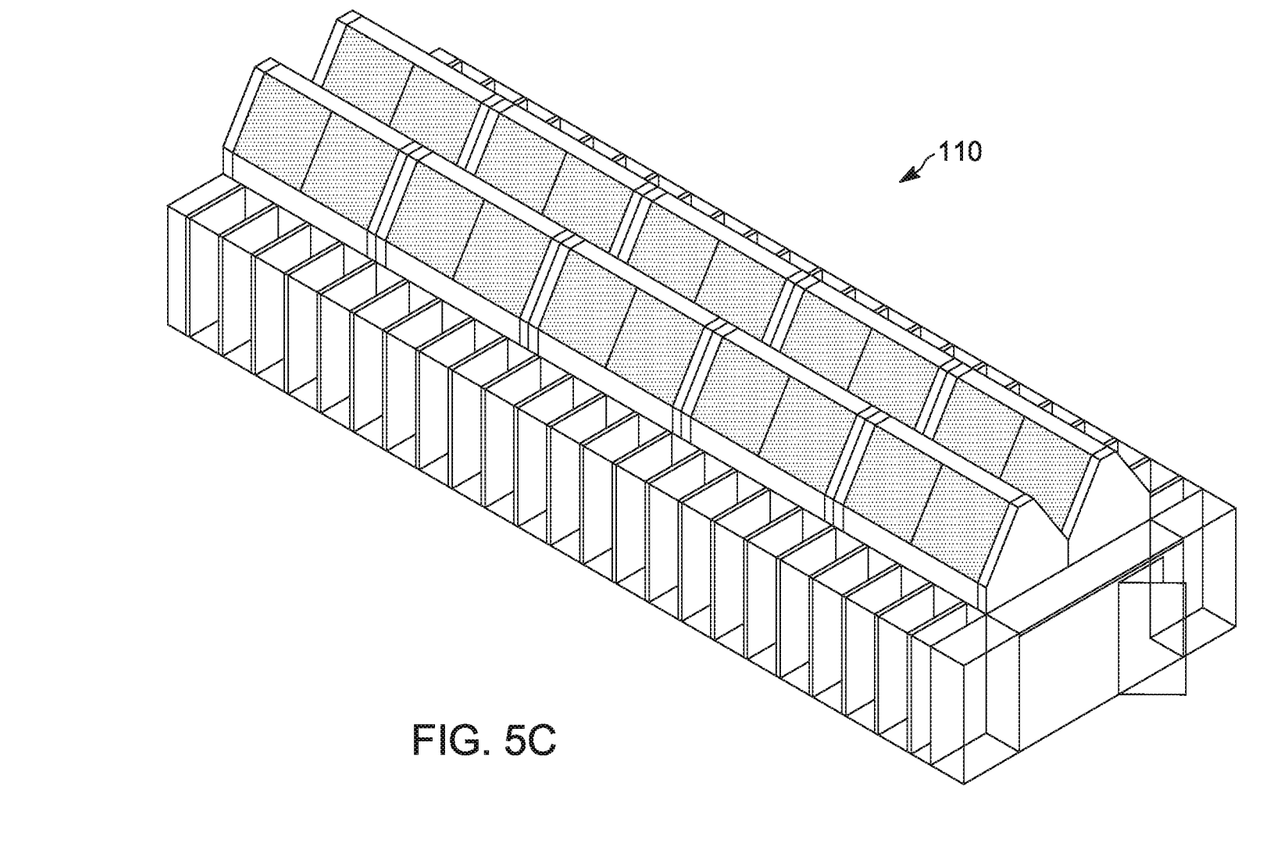

FIGS. 5A through 5C illustrate example data halls 110 with different levels of cooling density according to this disclosure. In particular, FIG. 5A illustrates a data hall 110 with low density cooling (e.g., approximately 3 kW-9 kW per rack), FIG. 5B illustrates a data hall 110 with medium density cooling (e.g., approximately 15 kW per rack), and FIG. 5C illustrates a data hall 110 with high density cooling (e.g., approximately 30 kW per rack). As shown in FIGS. 5A through 5C, the number of MHACUs 114 disposed above each data hall increases to provide greater cooling density.

Although FIGS. 1 through 5C illustrates example of cooling systems 100, 200 and related details, various changes may be made to FIGS. 1 through 5C. For example, various components in the cooling systems 100, 200 may be combined, further subdivided, replicated, rearranged, or omitted and additional components may be added according to particular needs. As a particular example, while the pump package 120 is shown upstream of the fluid cooler 130, the pump package 120 could be disposed downstream of the fluid cooler 130, such as between the fluid cooler 130 and the MHACUs 114 (in FIG. 1) or between the trim chiller 210 and the MHACUs 114 (in FIG. 2). As another example, in data centers with larger data halls 110, the cooling systems 100, 200 can include multiple fluid coolers 130, multiple trim chillers 210, and multiple pump packages 120 connected in parallel for common fluid connection of all components in the data hall 110. As still another example, in some data halls, one or more computer room air handler (CRAH) units could be implemented in addition to, or in lieu of, one or more of the MHACUs 114. In addition, while FIGS. 1 through 5C illustrate example cooling systems for use with data centers, the described functionality may be used in any other suitable device or system.

Figure 6:
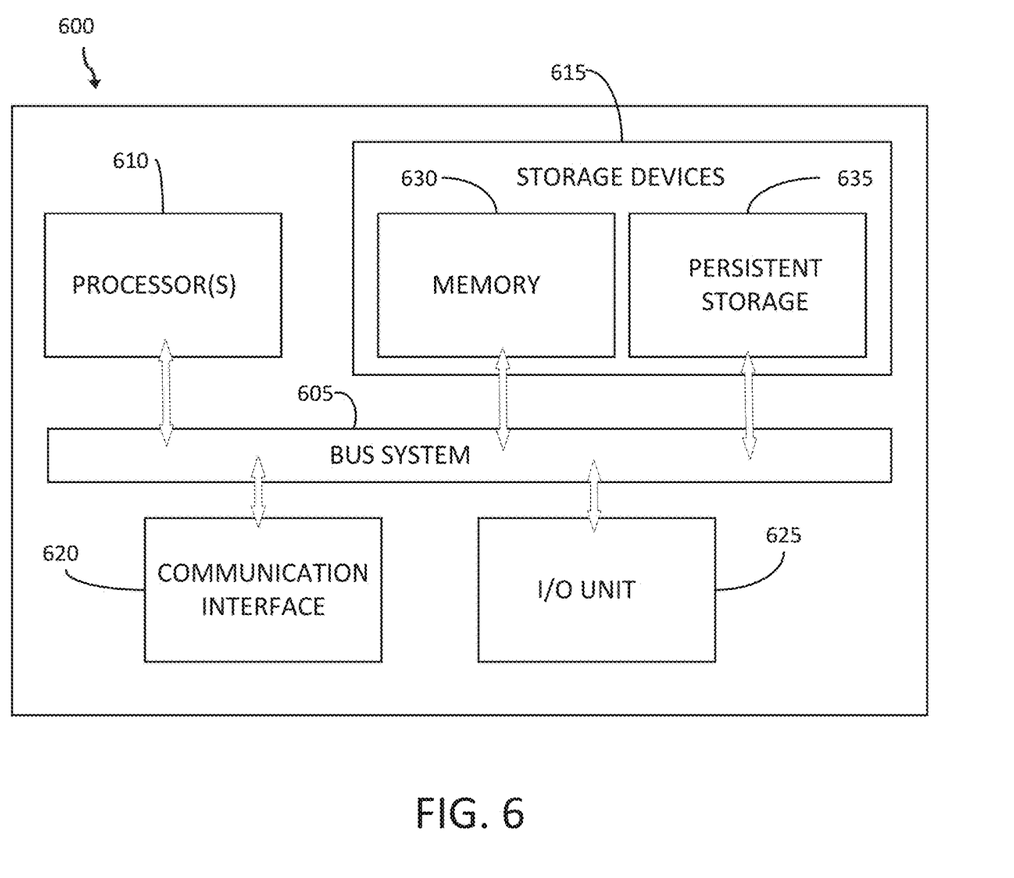
FIG. 6 illustrates an example of a computing device for use in a cooling system according to this disclosure.

FIG. 6 illustrates an example of a computing device 600 for use in a cooling system according to this disclosure. The computing device 600 may be the computing device 140 discussed above in FIG. 1. The computing device 600 can be configured to control operations in various components in the systems 100, 200. For example, the computing device 600 may control or monitor operations associated with the MHACU 114, the pump package 120, the fluid cooler 130, or the trim chiller 210.

As shown in FIG. 6, the computing device 600 includes a bus system 605, which supports communication between processor(s) 610, storage devices 615, communication interface (or circuit) 620, and input/output (I/O) unit 625. The processor(s) 610 executes instructions that may be loaded into a memory 630. The processor(s) 610 may include any suitable number(s) and type(s) of processors or other devices in any suitable arrangement. Example types of processor(s) 610 include microprocessors, microcontrollers, digital signal processors, field programmable gate arrays, application specific integrated circuits, and discrete circuitry.

The memory 630 and a persistent storage 635 are examples of storage devices 615, which represent any structure(s) capable of storing and facilitating retrieval of information (such as data, program code, and/or other suitable information on a temporary or permanent basis). The memory 630 may represent a random access memory or any other suitable volatile or non-volatile storage device(s). The persistent storage 635 may contain one or more components or devices supporting longer-term storage of data, such as a read-only memory, hard drive, Flash memory, or optical disc. For example, persistent storage 635 may store one or more databases of data, standards data, results, data, client applications, etc.

The communication interface 620 supports communications with other systems or devices. For example, the communication interface 620 could include a network interface card or a wireless transceiver facilitating communications over the system 200 or system 100. The communication interface 620 may support communications through any suitable physical or wireless communication link(s). The I/O unit 625 allows for input and output of data. For example, the I/O unit 625 may provide a connection for user input through a keyboard, mouse, keypad, touchscreen, or other suitable input devices. The I/O unit 625 may also send output to a display, printer, or other suitable output devices.

Although FIG. 6 illustrates one example of a computing device 600, various changes may be made to FIG. 6. For example, various components in FIG. 6 could be combined, further subdivided, or omitted and additional components could be added according to particular needs. As a particular example, while depicted as one system, the computing device 600 may include multiple computing systems that may be remotely located. In another example, different computing systems may provide some or all of the processing, storage, and/or communication resources according to this disclosure.

Figure 7:
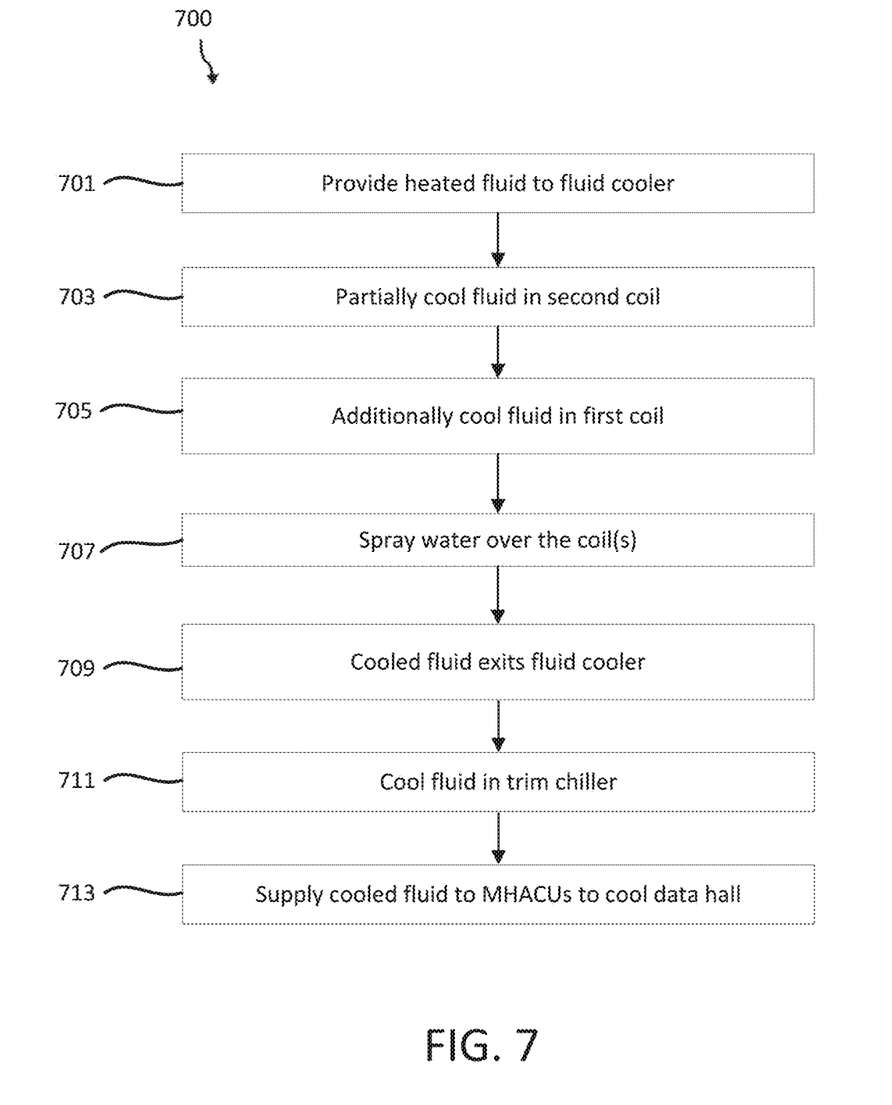
FIG. 7 is a flowchart illustrating an example of a cooling process using the cooling system of FIG. 1 according to various embodiments of the present disclosure.

FIG. 7 is a flowchart illustrating an example of a cooling process 700 using the cooling system 100 of FIG. 1 according to various embodiments of the present disclosure. The embodiment of the cooling process 700 shown in FIG. 7 is for illustration only. Other embodiments of the cooling process 700 could be used without departing from the scope of this disclosure.

Referring to FIG. 7, in operation 701, heated fluid from the MHACUs 114 is supplied to the fluid cooler 130 via the pump package 120. In operation 703, the heated fluid passes through the second coil 304 of the fluid cooler 130, where the fluid is partially cooled due to ambient air flowing over the second coil 304. In operation 705, the fluid passes through the first coil 302, where the fluid is additionally cooled due to ambient air flowing over the first coil 302. In operation 707, spray nozzles 306 spray water 312 over the first coil 302, the second coil 304, or both coils to provide evaporative cooling for cooling the fluid. In operation 709, the cooled fluid exits the fluid cooler 130. In operation 711, the cooled fluid optionally enters the trim chiller 210 and is additionally cooled in the trim chiller 210. In operation 713, the cooled fluid is conveyed to the MHACUs 114, in order to cool the heated air inside the data hall 110.

The process 700 discussed above illustrates example operations that can be implemented in accordance with the principles of the present disclosure, and various changes could be made to the process 700. For example, while shown as a series of steps, various steps in the process 700 could overlap, occur in parallel, occur in a different order, or occur multiple times. In another example, steps may be omitted or replaced by other steps.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:
   one or more modular hot aisle cooling units (MHACUs) disposed in a data hall, each MHACU configured to cool one or more servers in the data hall;
   a fluid cooler configured to receive heated fluid from the one or more MHACUs, cool the heated fluid into cooled fluid, and output the cooled fluid;
   a fluid supply line configured to convey the cooled fluid to the one or more MHACUs in order to cool heated air inside the data hall;
   a pump package configured to control a flow of the heated fluid and the cooled fluid; and
   a trim chiller configured to additionally cool the cooled fluid as the cooled fluid is output from the fluid cooler, the trim chiller comprising a refrigeration loop configured to transfer thermal energy from the cooled fluid to the heated fluid that is received from the one or more MHACUs,
   wherein the fluid cooler, the one or more MHACUs, and the pump package form a single fluid loop.

2. The system of claim 1, wherein:
   the fluid cooler comprises a first coil and a second coil,
   the second coil is configured to cool the heated fluid as the heated fluid passes through the second coil,
   the first coil is configured to additionally cool the heated fluid as the heated fluid passes through the first coil after passing through the second coil,
   the first coil and the second coil are disposed together in a common air stream, wherein air flows through the first coil and then through the second coil.

3. The system of claim 2, wherein the fluid cooler further comprises:
   one or more variable speed fans configured to control the common air stream.

4. The system of claim 2, wherein the fluid cooler further comprises:
   multiple spray nozzles configured to spray water over the first coil while the heated fluid passes through the first coil, the sprayed water providing evaporative cooling of the air stream.

5. The system of claim 4, wherein the fluid cooler further comprises:
   a moisture eliminator structure disposed between the first coil and the second coil, the moisture eliminator structure configured to prevent the sprayed water from reaching the second coil.

6. The system of claim 4, wherein the fluid cooler further comprises:
   a computing device configured to control the spraying of the water over the first coil based on at least one of: an ambient dry bulb temperature around the fluid cooler, and a cooling load of the cooled fluid.

7. The system of claim 1, wherein the pump package is disposed downstream from the one or more MHACUs and upstream from the fluid cooler.

8. A method comprising:
   receiving, at a fluid cooler, heated fluid from one or more modular hot aisle cooling units (MHACUs) disposed in a data hall, each MHACU configured to cool one or more servers in the data hall;
   cooling the heated fluid into cooled fluid at the fluid cooler, wherein cooling the heated fluid into the cooled fluid at the fluid cooler comprises:
      cooling the heated fluid in a second coil of the fluid cooler as the heated fluid passes through the second coil;
      spraying second water over the second coil using second spray nozzles while the heated fluid passes through the second coil, the second sprayed water providing evaporative cooling of air flow through the second coil;
      additionally cooling the heated fluid in a first coil of the fluid cooler as the heated fluid passes through the first coil after passing through the second coil; and
      spraying first water over the first coil using first spray nozzles while the heated fluid passes through the first coil, the first sprayed water providing evaporative cooling of air flow through the first coil, wherein the first coil and the second coil are disposed together in a common air stream and wherein air flows through the first coil and then through the second coil;
   outputting the cooled fluid from the fluid cooler;
   conveying the cooled fluid to the one or more MHACUs in order to cool heated air inside the data hall; and
   controlling a flow of the heated fluid and the cooled fluid using a pump package,
   wherein the fluid cooler, the one or more MHACUs, and the pump package form a single fluid loop.

9. The method of claim 8, further comprising:
   controlling the common air stream using one or more variable speed fans.

10. The method of claim 8, further comprising:
    a basin positioned beneath both the first and second coils and positioned to collect the first and second sprayed water;
    a first pump configured to return a portion of the collected water to the first spray nozzles; and
    a second pump configured to return another portion of the collected water to the second spray nozzles.

11. The method of claim 8, wherein a moisture eliminator structure is disposed between the first coil and the second coil, the moisture eliminator structure configured to prevent the first sprayed water from reaching the second coil.

12. The method of claim 8, further comprising:
controlling the spraying of the first water over the first coil based on at least one of: an ambient dry bulb temperature around the fluid cooler, and a cooling load of the cooled fluid.

13. The method of claim 8, further comprising:
additionally cooling the cooled fluid using a trim chiller after outputting the cooled fluid from the fluid cooler.

14. The method of claim 13, wherein the trim chiller comprises a refrigeration loop configured to transfer thermal energy from the cooled fluid to the heated fluid that is received from the one or more MHACUs.

15. The method of claim 8, wherein the pump package is disposed downstream from the one or more MHACUs and upstream from the fluid cooler.

16. A cooler comprising:
a first coil;
a second coil;
first spray nozzles;
second spray nozzles; and
a fluid supply line provided to couple the first coil and the second coil together in series,
wherein:
the second coil is configured to receive heated fluid conveyed through the fluid supply line from outside the cooler, and cool the heated fluid into cooled fluid as the heated fluid passes through the second coil,
the second spray nozzles are configured to second spray water over the second coil while the heated fluid passes through the second coil, the second sprayed water providing evaporative cooling of air flow through the second coil,
the first coil is configured to additionally cool the cooled fluid as the cooled fluid passes through the first coil after passing through the second coil,
the first spray nozzles configured to spray first water over the first coil while the heated fluid passes through the first coil, the sprayed first water providing evaporative cooling of air flow through the first coil,
the fluid supply line is configured to convey the cooled fluid outside the cooler after the cooled fluid passes through the first coil, and
the first coil and the second coil are disposed together in a common air stream, wherein air flows through the first coil and then through the second coil.

17. The cooler of claim 16, further comprising:
one or more variable speed fans configured to control the common air stream; and
a computing device configured to control the spraying of the first water over the first coil based on at least one of: an ambient dry bulb temperature around the cooler, and a cooling load of the cooled fluid.

18. The cooler of claim 16, further comprising:
a moisture eliminator structure disposed between the first coil and the second coil, the moisture eliminator structure configured to prevent the first sprayed water from reaching the second coil.

19. The cooler of claim 16, further comprising:
a basin positioned beneath both the first and second coils and positioned to collect the first and second sprayed water;
a first pump configured to return a portion of the collected water to the first spray nozzles; and
a second pump configured to return another portion of the collected water to the second spray nozzles.

20. A system comprising the cooler of claim 16 and further comprising:
a trim chiller configured to additionally cool the cooled fluid as the cooled fluid is output from the cooler, the trim chiller comprising a refrigeration loop configured to transfer thermal energy from the cooled fluid to the heated fluid that is received by the cooler.

* * * * *

UNITED STATES PATENT AND TRADEMARK OFFICE
CERTIFICATE OF CORRECTION

| | | |
|---|---|---|
| PATENT NO. | : 12,414,272 B2 | Page 1 of 1 |
| APPLICATION NO. | : 17/820880 | |
| DATED | : September 9, 2025 | |
| INVENTOR(S) | : Mecozzi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 297 days.

Signed and Sealed this
Sixteenth Day of December, 2025

John A. Squires
*Director of the United States Patent and Trademark Office*